(12) United States Patent
Irobe et al.

(10) Patent No.: US 11,424,430 B2
(45) Date of Patent: Aug. 23, 2022

(54) ORGANIC ELECTROLUMINESCENCE DEVICE, METHOD FOR MANUFACTURING ORGANIC ELECTROLUMINESCENCE DEVICE, HEAD-MOUNTED DISPLAY, AND ELECTRONIC APPARATUS

(71) Applicant: SEIKO EPSON CORPORATION, Tokyo (JP)

(72) Inventors: Jun Irobe, Chino (JP); Takefumi Fukagawa, Suwa-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 227 days.

(21) Appl. No.: 16/736,871

(22) Filed: Jan. 8, 2020

(65) Prior Publication Data
US 2020/0220108 A1    Jul. 9, 2020

(30) Foreign Application Priority Data

Jan. 9, 2019   (JP) .............................. JP2019-001683

(51) Int. Cl.
| | |
|---|---|
| H01L 51/52 | (2006.01) |
| G02B 27/12 | (2006.01) |
| G02B 5/32 | (2006.01) |
| H01L 51/56 | (2006.01) |
| H01L 27/32 | (2006.01) |

(52) U.S. Cl.
CPC ............ H01L 51/5265 (2013.01); G02B 5/32 (2013.01); G02B 27/126 (2013.01); H01L 51/5253 (2013.01); H01L 51/5271 (2013.01); *H01L 51/56* (2013.01); *H01L 27/322* (2013.01); *H01L 27/3244* (2013.01); *H01L 2227/323* (2013.01)

(58) Field of Classification Search
CPC ............. H01L 51/5265; H01L 51/5253; H01L 51/5271; H01L 51/56; H01L 27/322; H01L 27/3244; H01L 2227/323; G02B 5/32; G02B 27/126; G02B 5/287
See application file for complete search history.

(56) References Cited

U.S. PATENT DOCUMENTS

| | | | |
|---|---|---|---|
| 6,791,261 B1 * | 9/2004 | Shimoda ............. | H01L 51/5036 313/506 |
| 2008/0238308 A1 * | 10/2008 | So ....................... | H01L 51/5265 445/24 |

(Continued)

FOREIGN PATENT DOCUMENTS

| | | |
|---|---|---|
| JP | 2013-200467 A | 10/2013 |
| JP | 2014-056666 A | 3/2014 |

*Primary Examiner* — Kevin Quarterman
(74) *Attorney, Agent, or Firm* — Oliff PLC

(57) ABSTRACT

An organic electroluminescence device according to the present disclosure includes a light-emitting layer containing a light-emitting material, a first reflective layer configured to reflect light generated in the light-emitting layer, a second reflective layer disposed on an opposite side of the light-emitting layer from the first reflective layer, having light reflectivity and light transmissivity, to cause light generated in the light-emitting layer to resonate between the second reflective layer and the first reflective layer, and a dielectric multilayer film disposed on an opposite side of the second reflective layer from the light-emitting layer to cause light emitted from the second reflective layer to resonate.

9 Claims, 9 Drawing Sheets

(56) References Cited

U.S. PATENT DOCUMENTS

| | | | |
|---|---|---|---|
| 2009/0015141 A1* | 1/2009 | Wang | H01L 27/302 |
| | | | 313/504 |
| 2013/0250380 A1 | 9/2013 | Fujikawa et al. | |
| 2017/0090245 A1* | 3/2017 | Tsuchiya | H04N 5/23293 |
| 2020/0264461 A1* | 8/2020 | Kuwana | G02B 5/20 |

* cited by examiner

ORGANIC ELECTROLUMINESCENCE DEVICE, METHOD FOR MANUFACTURING ORGANIC ELECTROLUMINESCENCE DEVICE, HEAD-MOUNTED DISPLAY, AND ELECTRONIC APPARATUS

The present application is based on, and claims priority from JP Application Serial Number 2019-001683, filed Jan. 9, 2019, the disclosure of which is hereby incorporated by reference herein in its entirety.

BACKGROUND

1. Technical Field

The present disclosure relates to an organic electroluminescence device, a method for manufacturing an organic electroluminescence device, a head-mounted display, and an electronic apparatus.

2. Related Art

There are known electronic apparatuses such as a head-mounted display (HMD) provided with an organic electroluminescence (EL) device. In JP 2013-200467 A, it is described that an organic EL device having a resonance structure is used for an HMD provided with a reflective volume hologram to achieve narrowing of spectrum, to reduce unutilized light that passes through the reflective volume hologram, and to improve utilization efficiency of light at the HMD.

The light extraction efficiency in the resonance structure described in JP 2013-200467 A varies depending on the film thickness of the anode or the like provided between the reflective layer and the cathode. Unfortunately, due to the difficulty in adjusting the film thickness of the anode in accordance with a predetermined resonance wavelength range, an insufficient narrowing of spectrum is caused in the organic EL device described in JP 2013-200467 A, making it difficult to enhance the light extraction efficiency.

SUMMARY

An organic electroluminescence device according to an aspect of the present disclosure includes a light-emitting layer containing a light-emitting material, a first reflective layer configured to reflect light generated in the light-emitting layer, a second reflective layer disposed on an opposite side of the light-emitting layer from the first reflective layer, the second reflective layer having light reflectivity and light transmissivity to cause light generated in the light-emitting layer to resonate between the second reflective layer and the first reflective layer, and a dielectric multilayer film disposed on an opposite side of the second reflective layer from the light-emitting layer, the dielectric multilayer film causing light emitted from the second reflective layer to resonate.

A method for manufacturing an organic electroluminescence device according to an aspect of the present disclosure includes forming a light-emitting layer containing a light-emitting material, a first reflective layer configured to reflect light generated in the light-emitting layer, and a second reflective layer disposed on an opposite side of the light-emitting layer from the first reflective layer, the second reflective layer having light reflectivity and light transmissivity to cause light generated in the light-emitting layer to resonate between the second reflective layer and the first reflective layer, and forming a dielectric multilayer film disposed on an opposite side of the second reflective layer from the light-emitting layer, the dielectric multilayer film causing light emitted from the second reflective layer to resonate.

DESCRIPTION OF EXEMPLARY EMBODIMENTS

Figure 1:
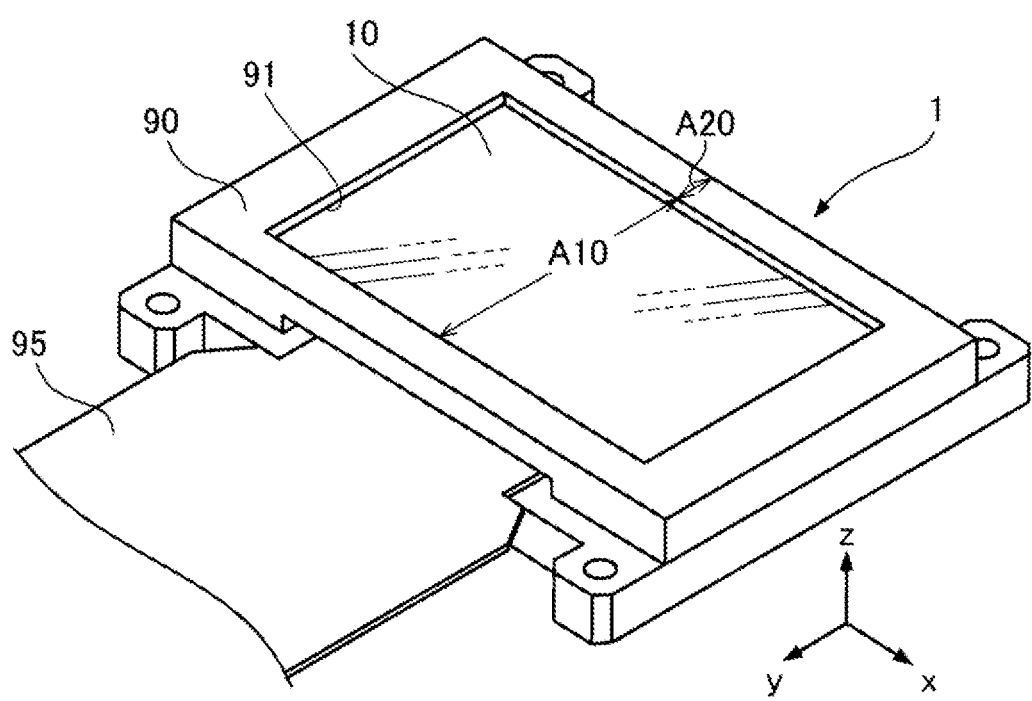
FIG. 1 is a perspective view illustrating an organic EL device according to a first embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the disclosure in the following descriptions. Note that, in the accompanying drawings, various hatchings may be provided as appropriate in order to facilitate understanding of the arrangement of the configuration of each of the layers.

1. Organic Electroluminescence Device

1-1. First Embodiment

FIG. 1 is a perspective view illustrating an organic EL device according to a first embodiment. Note that the description will be given below appropriately using an x-axis, a y-axis, and a z-axis orthogonal to each other illustrated in FIG. 1, for convenience of explanation. In the descriptions below, the direction of an arrow in the z-axis is a +z direction, which is referred to as "upper side", and the direction opposite to the arrow in the z-axis is a −z direction, which is referred to as "lower side". The surface of a substrate 11 described below is parallel to an x-y plane, and the stacking direction of the plurality of layers included in a display panel 10 described below is a z-direction.

1-1A. Overall Configuration

The organic EL device 1 illustrated in FIG. 1 is an organic EL display device configured to display a monochromatic image. Note that the monochromatic image includes an image that only displays character information. Specifically, the organic EL device 1 according to the first embodiment includes, for example, a device configured to display an image represented in green color, or a device configured to display an image represented in orange color. Note that the organic EL device 1 may be a device compatible with other colors in addition to green and orange colors. In addition, the organic EL device 1 is used as a micro display configured to display a monochromatic image such as character information at a head-mounted display, for example. Note that the head-mounted display will be described in detail later.

The organic EL device 1 includes a case 90 including an opening 91, the display panel 10 provided in the case 90, and a Flexible Printed Circuit (FPC) board 95 electrically coupled to the display panel 10 Note that, although not illustrated in the figure, the FPC board 95 is coupled to an upper rank circuit externally provided. In addition, the organic EL device 1 includes a light-emitting region A10 in which an image is displayed, and a non-light-emitting region A20 that surrounds the light-emitting region A10. Note that, although in the illustrated figure, the light-emitting region A10 forms a rectangular shape when viewed in a plan view, and the planar shape of the light-emitting region A10 may be, for example, circular or the like, without being limited to the rectangular shape. The language when viewed in a plan view refers to a viewing from the −z direction.

1-1B. Electrical Configuration

Figure 2:
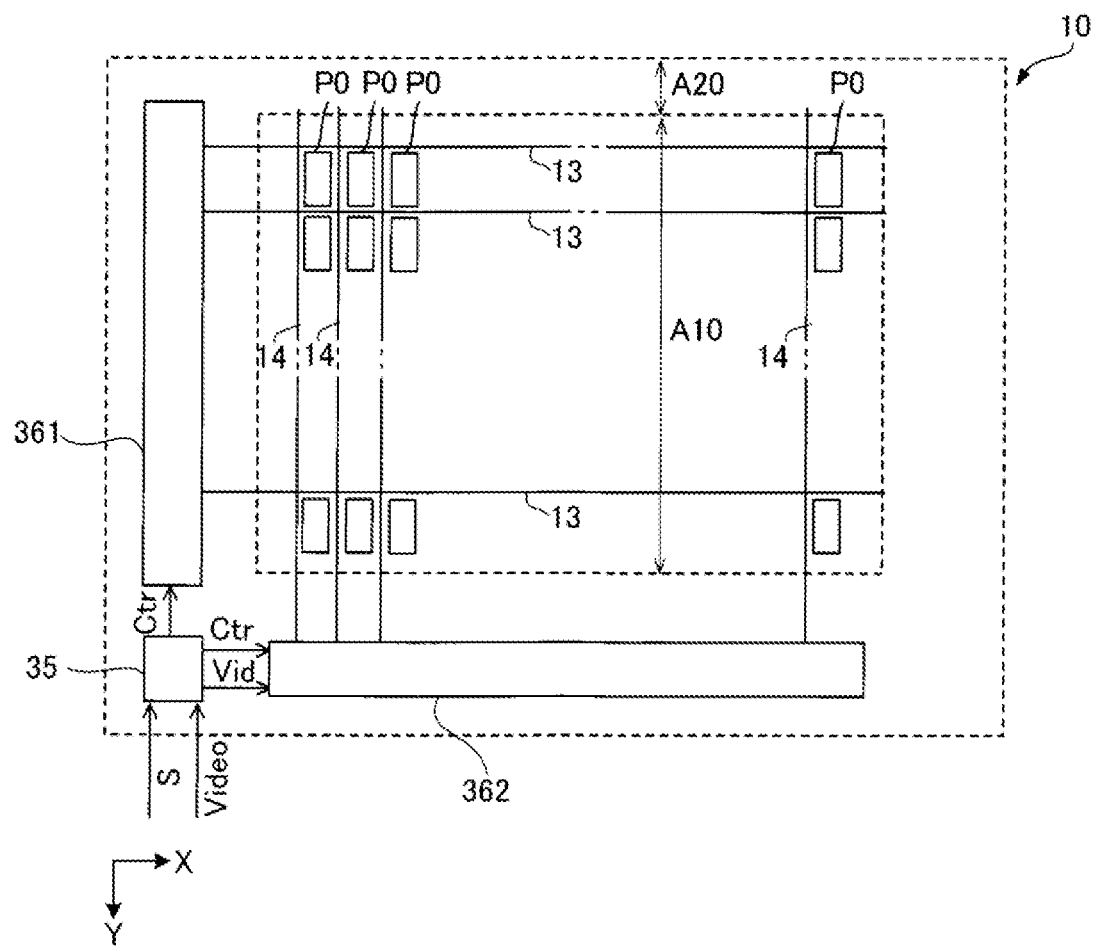
FIG. 2 is a block diagram illustrating an electrical configuration of a display panel according to a first embodiment.

FIG. 2 is a block diagram illustrating an electrical configuration of a display panel according to the first embodiment. The following descriptions will be given by appropriately using an X-axis and a Y-axis orthogonal to each other illustrated in FIG. 2, for convenience of explanation.

As illustrated in FIG. 2, the display panel 10 includes M scanning lines 13 extending along the X-axis, and N data lines 14 intersecting the scanning lines 13 and extending along the Y-axis. Note that M and N are natural numbers. In addition, a plurality of pixels P0 are provided corresponding to the respective intersections between the M scanning lines 13 and the N data lines 14. The pixels P0 are arranged in a matrix pattern in the light-emitting region A10.

Further, the display panel 10 includes a control circuit 35, a scanning-line drive circuit 361, and a data-line drive circuit 362. The control circuit 35, the scanning-line drive circuit 361, and the data-line drive circuit 362 are arranged in the non-light-emitting region A20. Further, the display panel 10 is also coupled to a non-illustrated power supply circuit.

The control circuit 35 illustrated in FIG. 2 is configured to control image displaying. The control circuit 35 is supplied with an image data Video being digital signal, synchronously with a synchronization signal S from a non-illustrated upper rank circuit. The control circuit 35 generates a control signal Ctr based on the synchronization signal S and supplies the control signal Ctr to the scanning-line drive circuit 361 and the data-line drive circuit 362. The control circuit 35 also generates an image signal Vid being analog signal, based on the image data Video, and supplies the image signal Vid to the data-line drive circuit 362. Note that the image data Video described above are data that regulate gradation levels of the pixels P0 by, for example, eight bits. The synchronization signal S is a signal including a vertical synchronization signal, a horizontal synchronization signal, and a dot clock signal.

The scanning-line drive circuit 361 is coupled to the M scanning lines 13. The scanning-line drive circuit 361, based on the control signal Ctr, generates scanning signals for sequentially selecting the M scanning lines 13 one by one within one frame period, and outputs the generated scanning signals to the M scanning lines 13. The data-line drive circuit 362 is also coupled to the N data lines 14. The data-line drive circuit 362, based on the image signal Vid and the control signal Ctr, generates data signals commensurate with the gradations to be displayed, and outputs the generated data signals to the N data lines 14.

Note that the scanning-line drive circuit 361 and the data-line drive circuit 362 may be integrated with each other, as a single drive circuit. Further, although in the illustrated figure, the control circuit 35 is provided at the display panel 10, the control circuit 35 may be provided at the FPC board 95 illustrated in FIG. 1, for example. In addition, the control circuit 35, the scanning-line drive circuit 361, and the data-line drive circuit 362 may each be divided into a plurality of sections.

Figure 3:
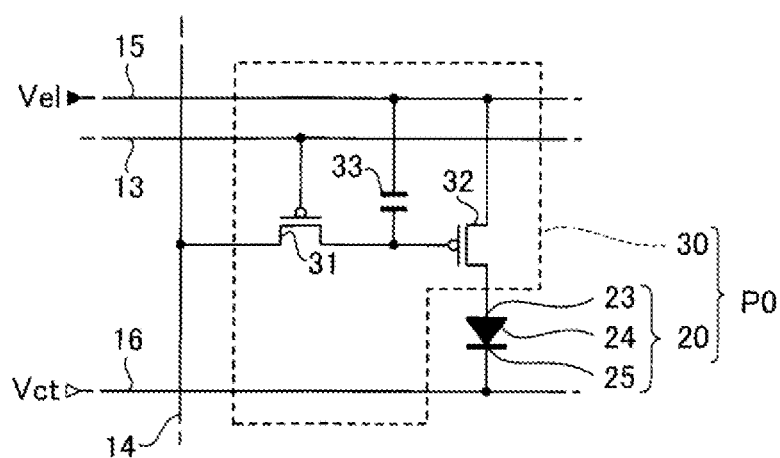
FIG. 3 is an equivalent circuit diagram of a pixel according to a first embodiment.

FIG. 3 is an equivalent circuit diagram of a pixel according to the first embodiment. As illustrated in FIG. 3, the pixel P0 is provided with a light-emitting element 20 constituted by an Organic Light Emitting Diode (OLED) and a pixel circuit 30 configured to control the drive of the light-emitting element 20.

The light-emitting element 20 includes an anode 23, an organic layer 24, and a cathode 25. The anode 23 supplies holes to the organic layer 24. The cathode 25 supplies electrons to the organic layer 24. In the light-emitting element 20 thus configured, the holes supplied from the anode 23 and the electrons supplied from the cathode 25 recombine in the organic layer 24, and then the organic layer 24 emits white light. Note that a power supplying line 16 is electrically coupled to the cathode 25. The power supplying line 16 is supplied with a power supply potential Vct at a low potential side from the non-illustrated power supply circuit.

The pixel circuit 30 includes a switching transistor 31, a driving transistor 32, and a holding capacitor 33. The gate of the switching transistor 31 is electrically coupled to the scanning line 13. Further, one of the source or the drain of the switching transistor 31 is electrically coupled to the data line 14, while the other is electrically coupled to the gate of the driving transistor 32. In addition, one of the source or the drain of the driving transistor 32 is electrically coupled to a power supplying line 15, while the other is electrically coupled to the anode 23. Note that the power supplying line 15 is supplied with a power supply potential Vel at a high potential side from the non-illustrated power supply circuit. Moreover, one electrode of the holding capacitor 33 is coupled to the gate of the driving transistor 32, while the other electrode is coupled to the power supplying line 15.

In the display panel 10 thus electrically configured, the scanning-line drive circuit 361 activates a scanning signal to select the scanning line 13, to thus turn on the switching transistor 31 provided in the selected pixel P0. Then, a data signal is supplied from the data line 14 to the driving transistor 32 corresponding to the scanning line 13 thus selected. The driving transistor 32 supplies a current commensurate with a potential of the supplied data signal, that is, a current commensurate with a potential difference between the gate and the source, to the light-emitting element 20. Then, the light-emitting element 20 emits light at a luminance commensurate with a magnitude of the current supplied from the driving transistor 32.

When the scanning-line drive circuit 361 releases the selection of the scanning line 13 and the switching transistor 31 is turned off, the potential of the gate of the driving transistor 32 is held by the holding capacitor 33. This allows the light-emitting element 20 to emit light even after the switching transistor 31 has been turned off.

The above is the electrical configuration of the display panel 10. Note that, the configuration of the pixel circuit 30 is, but not limited to, the illustrated configuration. For example, an additional transistor may be provided, which is configured to control an electrical continuity between the anode 23 and the driving transistor 32.

1-1C. Configuration of Display Panel

Figure 4:
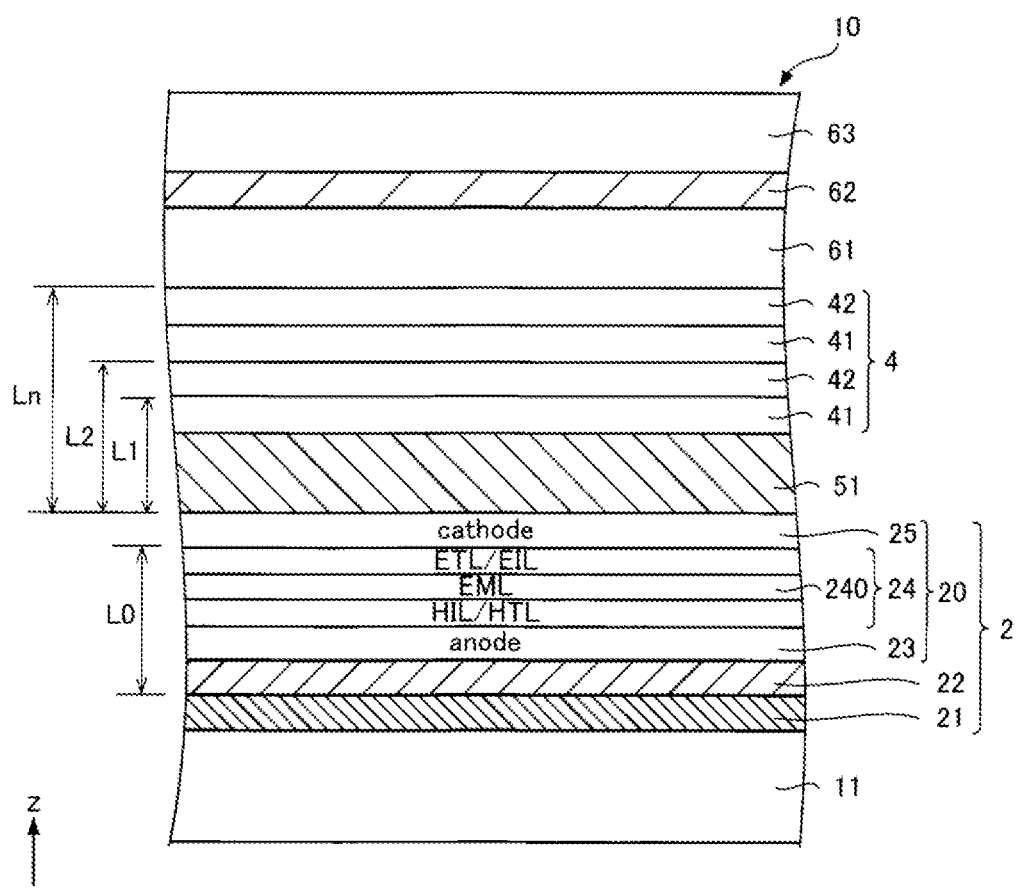
FIG. 4 is a view schematically illustrating a partial cross-section of a subpixel of a display panel according to a first embodiment.

Next, a configuration of the display panel 10 will be briefly described below. FIG. 4 is a view schematically illustrating a partial cross-section of a subpixel of a display panel according to the first embodiment. Here, in the following descriptions, the term light transmissivity refers to transmissivity to visible light, in which the transmittance of visible light may be 50% or higher. In addition, the term light reflectivity refers to reflectivity to visible light, where the reflectance of visible light may be 50% or higher.

The display panel 10 illustrated in FIG. 4 includes the substrate 11, a light-emitting portion 2 including the organic layer 24, a protective film 51, a dielectric multilayer film 4, a color filter 61, and a cover 63. The light-emitting portion 2, the protective film 51, the dielectric multilayer film 4, and the color filter 61 are stacked in this order from the substrate 11 toward the cover 63. The display panel 10 is of top-emission type, where light generated in the organic layer 24 passes through the cover 63 to exit outward. In the first embodiment, the display panel 10 also emits monochromatic light. The display panel 10 causes the light-emitting portion 2 and the dielectric multilayer film 4 to each enhance light within a predetermined wavelength range in white light generated in the organic layer 24. Each of the layers of the display panel 10 will be orderly described below.

Substrate

The substrate 11 includes, for example, a substrate body constituted by silicon, a wiring layer including a plurality of electronic components, wirings, and the like, and a plurality of interlayer insulating films constituted by, for example, a silicon nitride film or a silicon oxide film, and covering the wiring layer. Note that, the constituent material of the substrate body may also be, for example, glass, resin, ceramic, or the like, without being limited to silicon. Further, because the display panel 10 is of top-emission type, the substrate 11 is not required to have light transmissivity. In addition, the wiring layer also includes the scanning lines 13 and the data lines 14 that are described above.

Light-Emitting Portion

The light-emitting portion 2 that causes light within a predetermined wavelength range to resonate is disposed, over the substrate 11, at the surface of the substrate 11 on the +z side. The light-emitting portion 2 includes a reflective layer 21, a resonance adjustment layer 22, and the light-emitting element 20. The light-emitting element 20 includes the anode 23, the organic layer 24, and the cathode 25, as described above.

The reflective layer 21 is disposed on the substrate 11. The reflective layer 21 may be provided in a state being in contact with the plurality of interlayer insulating films and the wiring layer of the substrate 11. The reflective layer 21 is a "first reflective layer" having light reflectivity. The reflective layer 21 reflects light generated from the organic layer 24 toward the organic layer 24. The reflective layer 21 is, for example, a stacked body in which a layer containing titanium (Ti) and a layer containing Al—Cu alloy are stacked on the substrate 11 in this order. Note that the reflective layer 21 is not limited to such a configuration as long as having light reflectivity.

The resonance adjustment layer 22 is disposed at the surface of the reflective layer 21 on the +z side. The resonance adjustment layer 22 is a layer for adjusting an optical distance L0, which is the optical distance between the reflective layer 21 and the cathode 25. The film thickness of the resonance adjustment layer 22 is set in common among the pixels P0. In addition, the resonance adjustment layer 22 is configured to include, for example, silicon dioxide or silicon nitride.

The anode 23 is disposed at the surface of the resonance adjustment layer 22 on the +z side. The film thickness of the anode 23 is set such that the optical distance L0 is adjusted. Each of the thicknesses of the anode 23 and the resonance adjustment layer 22 described above is adjusted to extract light within a predetermined resonance wavelength range. Note that the optical distance L0 may be adjusted by means of only one of the anode 23 or the resonance adjustment layer 22. In addition, the anode 23 is constituted by a transparent conductive material such as Indium Tin Oxide (ITO) or Indium Xinc Oxide (IZO), for example. Note that, although not specifically illustrated in the figure, the anode 23 is provided for each of the pixels P, and the anodes 23 are provided spaced apart from each other.

The organic layer 24 is disposed at the surface of the anode 23 on the +z side. The organic layer 24 includes at least a light-emitting layer 240 including a material that emits light due to current supply. In the first embodiment, the light-emitting layer 240 includes a layer containing a blue-light-emitting material, a layer containing a green-light-emitting material, and a layer containing a red-light-emitting material. Blue light is generated in the layer containing the blue-light-emitting material, green light is generated in the layer containing the green-light-emitting material, and red light is generated in the layer containing the red-light-emitting material. Thus, it can be also referred that white light is generated in the light-emitting layer 240. In the first embodiment, there are also provided a hole injecting layer (HIL), a hole transporting layer (HTL), an electron injecting layer (EIL), and an electron transporting layer (ETL), in addition to the light-emitting layer 240. In the organic layer 24, holes injected from the hole injecting layer and electrons transported from the electron transporting layer are recombined in the light-emitting layer 240. In addition, each of the layers included in the organic layer 24 is deposited by, for example, a vapor phase process. Note that the organic layer 24 may be arbitrarily configured, where in the organic layer 24, any of the layers described above may not be provided, and any additional layer may further be provided.

The cathode 25 is disposed at the surface of the organic layer 24 on the +z side. The cathode 25 is a "second reflective layer" having light transmissivity and light reflectivity. The cathode 25 is a common electrode provided continuously across the plurality of pixels P. The cathode 25 is constituted by magnesium and silver, or alloys containing these materials as main constituents, and the like, for example.

The light-emitting portion 2 thus constituted causes light within a predetermined wavelength range, of light generated in the organic layer 24 to resonate between the reflective layer 21 and the cathode 25. Note that the resonance in the light-emitting portion 2 will be described in detail later.

Protective Film

The protective film 51 protective of the light-emitting layer 240 is disposed, between the cathode 25 and the dielectric multilayer film 4, in a state being in contact with the cathode 25 and the dielectric multilayer film 4. In the first embodiment, the protective film 51, which is disposed over the cathode 25, seals the light-emitting portion 2. The provision of the protective film 51 allows the light-emitting layer 240 to be protected from atmospheric moisture, oxygen, and the like. This allows the quality of the display panel 10 to be enhanced compared to a case where the protective film 51 is not provided.

The protective film 51 is constituted by an inorganic material containing silicon nitride or silicon oxynitride, for example. This allows sealing performance of the protective film 51 to be enhanced compared to a case where the protective film is constituted by an organic material. In addition, supposing that the protective film 51 is an organic material, constituents of the protective film 51 may invade into the organic layer 24, however, according to a configuration in which the protective film 51 is constituted by an inorganic material, the organic layer 24 is possibly prevented from being invaded by the constituents. Further, the protective film 51 including the inorganic material can be formed using gas phase deposition method. In particular, the protective film 51 may be formed using plasma Chemical Vapor Deposition (CVD) method or ion plating method. Using such a method makes it possible to form the protective film 51 of high density. This achieves the protective film 51 having high gas barrier properties.

Note that the protective film 51 may be constituted by only one of silicon nitride or silicon oxynitride or only both of these materials, and may also contain other materials to the extent that sealing performance of the protective film 51 is not deteriorated.

The protective film 51 favorably has a thickness of not less than 100 nm and not greater than 1500 nm, and more favorably not less than 200 nm and not greater than 1200 nm, and still more favorably not less than 400 nm and not greater than 1000 nm. The protective film 51 having a thickness within such a range enables the organic layer 24 to be sufficiently protected from atmospheric moisture, oxygen, and the like, concurrently preventing the display panel 10 from becoming excessively thick.

Dielectric Multilayer Film

The dielectric multilayer film 4 is disposed over the protective film 51. The dielectric multilayer film 4 includes a plurality of low refractive index films 41 with refractive index of n1, and a plurality of high refractive index films 42 with refractive index of n2 that is greater than the refractive index of n1. The low refractive index film 41 and the high refractive index film 42 are alternately stacked in a repeated manner. The low refractive index film 41 is disposed over the protective film 51. That is, the lowermost layer in the dielectric multilayer film 4 is the low refractive index film 41, and may also be the high refractive index film 42. The uppermost layer of the dielectric multilayer film 4 is the high refractive index film 42, and may also be the low refractive index film 41.

The low refractive index film 41 is constituted by silicon oxide such as silicon dioxide, and the high refractive index film 42 is constituted by aluminum oxide. Note that the low refractive index film 41 and the high refractive index film 42 are each "dielectric film". The low refractive index film 41 and the high refractive index film 42 having a configuration including the materials described above makes it possible to regulate the film thickness of the dielectric multilayer film 4 at high accuracy.

In addition, the low refractive index film 41 and the high refractive index film 42 may be formed by Atomic Layer Deposition (ALD) method. Using such a method allows a layer having target film thickness to be deposited with high accuracy and with easiness. Accordingly, the dielectric multilayer film 4 with high resonance performance can be obtained compared to a case where other methods are used.

The dielectric multilayer film 4 thus obtained causes light within a predetermined wavelength range, of light emitted from the light-emitting portion 2 to resonate. Note that the resonance in the dielectric multilayer film 4 will be described in detail later.

Color Filter

The color filter 61 is disposed over the dielectric multilayer film 4. The color filter 61, which is compatible with light within a predetermined wavelength range, selectively transmits light within the predetermined wavelength range.

Cover

The cover 63 is disposed over the color filter 61 with an adhesive layer 62 interposed in between. The cover 63 having light transmissivity is constituted by, for example, a glass substrate or a quartz substrate. The adhesive layer 62 may be constituted by any material as long as the cover 63 can be caused to adhere to the color filter 61 and the adhesive layer 62 has light transmissivity, and the adhesive layer 62 is constituted by a transparent resin material such as, for example, epoxy resin or acrylic resin.

The display panel 10 configured as described above, by combining the light-emitting portion 2 and the dielectric multilayer film 4, makes it possible to enhance extraction efficiency of light within a predetermined wavelength range. Each of the resonance structures of the light-emitting portion 2 and the dielectric multilayer film 4 will be described below.

As described above, the organic EL device 1 includes the light-emitting portion 2 and the dielectric multilayer film 4. The light-emitting portion 2 includes the light-emitting layer 240 containing a light-emitting material, the reflective layer 21 configured to reflect light generated in the light-emitting layer 240, and the cathode 25 disposed on an opposite side of the light-emitting layer 240 from the reflective layer 21. The light-emitting portion 2 causes light within a predetermined wavelength range of light generated in the light-emitting layer 240 to resonate between the reflective layer 21 and the cathode 25. The light-emitting portion 2 causes light generated in the light-emitting layer 240 to be multiply reflected between the reflective layer 21 and the cathode 25, to selectively enhance light within the predetermined wavelength range. The cathode 25 having light reflectivity and light transmissivity causes a part of light that resonates between the reflective layer 21 and the cathode 25 passes through the cathode 25 to exit toward the +z side. The dielectric multilayer film 4 is disposed on an opposite side of the cathode 25 from the light-emitting layer 240, and the light emitted from the cathode 25 are incident on the dielectric multilayer film 4. The dielectric multilayer film 4 causes light within a predetermined wavelength range of light emitted from the light-emitting portion 2 to resonate. That is, the dielectric multilayer film 4 selectively enhances light within the predetermined wavelength range of light emitted from the light-emitting portion 2. In addition, in the first embodiment, the resonance wavelength range between the reflective layer 21 and the cathode 25 overlaps the resonance wavelength range by the dielectric multilayer film 4.

The provision of the dielectric multilayer film 4 in addition to the light-emitting portion 2 allows the display panel 10 to emit more intense spectrum of light with narrower width than a case where the dielectric multilayer film 4 is not provided. This allows light extraction efficiency of the display panel 10 to be enhanced, thus enhancing brightness of display and narrowing spectrum of the light.

The light-emitting portion 2 causes at least a part of light generated in the organic layer 24 to resonate between the reflective layer 21 and the cathode 25, thus enhancing light within the resonance wavelength range corresponding to the optical distance L0. The light resonant between the reflective layer 21 and the cathode 25 pass through the cathode 25 to exit in the +z direction. Causing the light to resonate between the reflective layer 21 and the cathode 25 makes it possible to extract light having high intensity and spectrum of narrow half-value width from the cathode 25.

The resonance wavelength range in the light-emitting portion 2 can be adjusted by altering the optical distance L0. That is, the optical distance L0 is set corresponding to light within a wavelength range to be extracted. Provided that the peak wavelength of the spectrum of light within a predetermined wavelength range to be extracted of light generated in the light-emitting layer 240 is $\lambda 0$, the following relationship [1] stands. $\Phi$ (radians) represents the sum of phase shifts that occur at the time when the light passes through and are reflected within the light-emitting portion 2.

$$\{(2L0)/\lambda 0 + \Phi\}/(2\pi) = m0 \ (m0 \text{ is an integer}) \quad [1]$$

Each of the thicknesses of the resonance adjustment layer 22 and the anode 23 is appropriately set to render the peak wavelength in the resonance wavelength range into the predetermined wavelength $\lambda 0$, to thus regulate the optical distance L0 to reach a target value designed. The adjustment thus conducted makes it possible to achieve enhancement of intensity of light within a predetermined wavelength range to be extracted and narrowing of spectrum of the light.

The dielectric multilayer film 4 causes at least a part of light emitted from the light-emitting portion 2 to resonate within the dielectric multilayer film 4, to enhance light within a resonance wavelength range corresponding to an optical distance Ln. In the first embodiment, the protective film 51 provided over the cathode 25 allows the optical distance Ln to be optical distances between an interface between the cathode 25 and the protective film 51 and interfaces in the dielectric multilayer film 4. In the dielectric multilayer film 4, a reflection occurs at each of the interfaces due to the difference in the refractive indexes between the low refractive index film 41 and the high refractive index film 42. In the dielectric multilayer film 4, light other than light within a predetermined wavelength range is reflected to interfere with each other, so as to attenuate the light, and light within the predetermined wavelength range that passes through the respective interfaces is caused to resonate by causing the light to interfere with each other such that the light enhance each other. The lights resonant in the dielectric multilayer film 4 exit from the uppermost layer in the +z direction. Causing the light to resonate within the dielectric multilayer film 4 makes it possible to extract light having high intensity and spectrum of narrow half-value width from the cathode 25.

The resonance wavelength range by the dielectric multilayer film 4 can be adjusted by altering the optical distance Ln. That is, the optical distance Ln is set corresponding to the light of a wavelength to be extracted. The "n" of the optical distance Ln is an integer equal to or greater than 1. For example, the optical distance L1 is the distance between the interface between the cathode 25 and the protective film 51, and the interface between the low refractive index film 41 at the lowermost layer and the high refractive index film 42 at the second layer from the lowermost layer. For example, the optical distance L2 is the distance between the interface between the cathode 25 and the protective film 51, and the interface between the high refractive index film 42 at the second layer from the lowermost layer and the high refractive index film 42 at the third layer from the lowermost layer.

Provided that the peak wavelength of the spectrum of light of a predetermined wavelength to be extracted, of light incident on the dielectric multilayer film 4 is $\lambda n$, the following relationship [2] stands. $\Phi$ (radians) represents a phase shift that occurs at the time when light being incident on the dielectric multilayer film 4 is reflected at the respective interfaces in the dielectric multilayer film 4.

$$\{(2Ln)/\lambda n + \Phi\}/(2\pi) = m \ (m \text{ is an integer}) \quad [2]$$

Each of the thicknesses of the layers is set to render the peak wavelength in the resonance wavelength range into the predetermined wavelength $\lambda n$, to thus regulate the optical distance Ln to reach a target value designed. The adjustment thus conducted makes it possible to achieve enhancement of intensity of light within a predetermined wavelength range to be extracted and narrowing of spectrum of the light.

In addition, in the first embodiment, the resonance wavelength range between the reflective layer 21 and the cathode 25 overlaps the resonance wavelength range by the dielectric multilayer film 4, as described above. The language resonance wavelength ranges overlap represents the resonance wavelength ranges overlap, with a difference between the peak wavelengths being within a range of 4 nm. These resonance wavelength ranges overlap, to enable light within an identical wavelength range to resonate in the light-emitting portion 2 and the dielectric multilayer film 4. Accordingly, light within a predetermined wavelength range, which has been enhanced in the light-emitting portion 2, can further be enhanced in the dielectric multilayer film 4. This makes it possible to achieve enhancement of intensity of light within a predetermined wavelength range and narrowing of spectrum of the light in a particularly effective manner.

Figure 5:
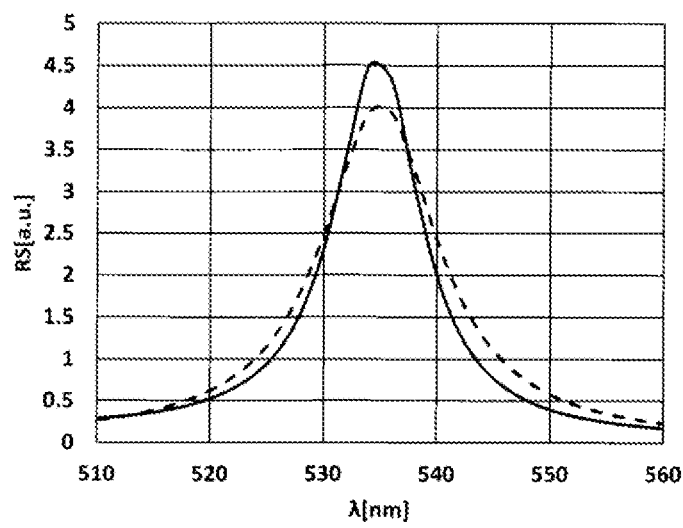
FIG. 5 is a graph depicting a spectrum of light within a green color wavelength range.

FIG. 5 is a graph depicting a spectrum of light within a green color wavelength range. In FIG. 5, a solid line represents a spectrum of light passed through the display panel 10 including the light-emitting portion 2 and the dielectric multilayer film 4 according to the first embodiment, and in FIG. 5, a dashed line represents a spectrum of light passed through the display panel 10 devoid of the dielectric multilayer film 4. The horizontal axis of the graph represents a wavelength λ [nm], and the vertical axis represents a relative intensity RS [a.u.].

As illustrated in FIG. 5, the half-value width of light emitted from the display panel 10 including the light-emitting portion 2 and the dielectric multilayer film 4 is narrower than the half-value width of light emitted from the display panel 10 devoid of the dielectric multilayer film 4. In addition, an intensity of light emitted from the display panel 10 including the light-emitting portion 2 and the dielectric multilayer film 4 is higher than an intensity of light emitted from the display panel 10 devoid of the dielectric multilayer film 4. As recognizable from FIG. 5, the provision of the dielectric multilayer film 4 makes it possible to achieve enhancement of intensity and narrowing of light within a predetermined wavelength range.

Note that in the above descriptions, the film thickness of each of the layers constituting the dielectric multilayer film 4 is adjusted to regulate the resonance wavelength range, however, for example, a material or the like constituting the dielectric multilayer film 4 may be altered to regulate the refractive index and the like of each of the dielectric films, to thus regulate the resonance wavelength range.

Further, the dielectric multilayer film 4, in addition to the function of causing light within a predetermined wavelength range to resonate, has a function of protecting the light-emitting layer 240 from atmospheric moisture and the like together with the protective film 51. This allows protection performance of the light-emitting layer 240 to be enhanced compared to a case where the dielectric multilayer film 4 is not provided. In addition, the provision of the dielectric multilayer film 4 makes it possible to reduce an occurrence of cracks or the like irrespective of formation of a minute step, compared to a case where the dielectric multilayer film 4 is not provided. Thus, the provision of the dielectric multilayer film 4 allows the display panel 10 to achieve enhancement of intensity and narrowing of light, and reinforcement of the protection of the light-emitting layer 240.

Moreover, as described above, the display panel 10 includes the color filter 61 that selectively transmits light within a predetermined wavelength range. In the first embodiment, the color filter 61 selectively transmits light within the same wavelength range as the resonance wavelength range in the light-emitting portion 2 and the dielectric multilayer film 4. This allows a color purity of light emitted from the display panel 10 to be enhanced compared to a case where the color filter 61 is not provided.

Note that, although in the illustrated figure, the display panel 10 includes the color filter 61, the display panel 10 is not required to include the color filter 61. Further, although in the illustrated figure, the display panel 10 includes the protective film 51, the display panel 10 is not required to include the protective film 51. In addition, although in the illustrated figure, the dielectric multilayer film 4 includes two layers of each of the low refractive index film 41 and the high refractive index film 42, the dielectric multilayer film 4 is required to include at least one layer of each of the low refractive index film 41 and the high refractive index film 42, where the number of layers is not limited to the illustrated example.

Moreover, in the above descriptions, the light-emitting layer 240 generates white light, however, the light-emitting layer 240 may only emit light within a predetermined wavelength range. In this case, the light-emitting layer 240 may be configured to only include one of a blue light-emitting material, a green light-emitting material, or a red light-emitting material, for example. Also in this case, the light-emitting layer 240 is configured to include a light-emitting material that emits light containing a component within the same wavelength range as the resonance wavelength range in the light-emitting portion 2 and the dielectric multilayer film 4. This configuration makes it possible to achieve enhancement of intensity and narrowing of light within a predetermined wavelength range generated in the light-emitting layer 240.

In addition, although in the above descriptions, the resonance wavelength range between the reflective layer 21 and the cathode 25 overlaps the resonance wavelength range by the dielectric multilayer film 4, with a difference between the peak wavelengths being within a range of 4 nm, the difference between the peak wavelengths may be out of the range. That is, the resonance wavelength range between the reflective layer 21 and the cathode 25 is not required to overlap with the resonance wavelength range by the dielectric multilayer film 4.

1-1D. Method for Manufacturing Organic EL Device 1

Figure 6:
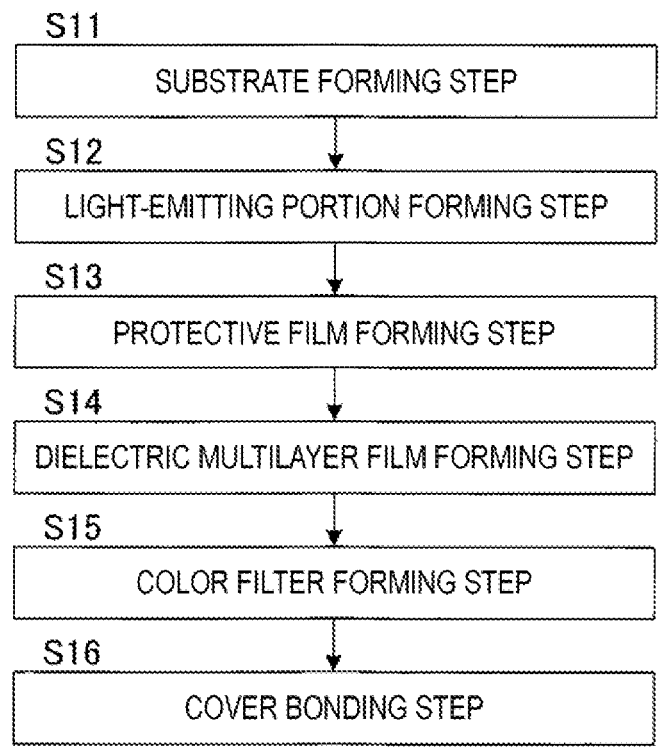
FIG. 6 is a flowchart illustrating a method for manufacturing a display panel according to a first embodiment.

Next, a method for manufacturing a display panel 10 included in the organic EL device 1 will be described below. FIG. 6 is a flowchart illustrating a method for manufacturing the display panel 10 according to the first embodiment. As illustrated in FIG. 6, the method for manufacturing the display panel 10 includes a substrate forming step S11, a light-emitting portion forming step S12, a protective film forming step S13, a dielectric multilayer film forming step S14, a color filter forming step S15, and a cover bonding step S16. These steps are sequentially performed to manufacture the display panel 10. The layers of the organic EL device 1 illustrated in FIG. 4 are sequentially stacked from a substrate 11 toward a cover 63 to form the display panel 10.

Substrate Forming Step S11

In the substrate forming step S11, a substrate body constituted by a silicon plate and the like is prepared, and then a wiring layer and an interlayer insulating film are formed on the substrate body. The wiring layer is formed by forming a metal film using sputtering method or vapor deposition method, and patterning the metal film using photolithography method, for example. In addition, the interlayer insulating film is formed by forming an insulating film using vapor deposition method or the like, and applying a planarization treatment to the insulating film by polishing method such as chemical mechanical polishing (CMP) method or the like.

Light-Emitting Portion Forming Step S12

Figure 7:
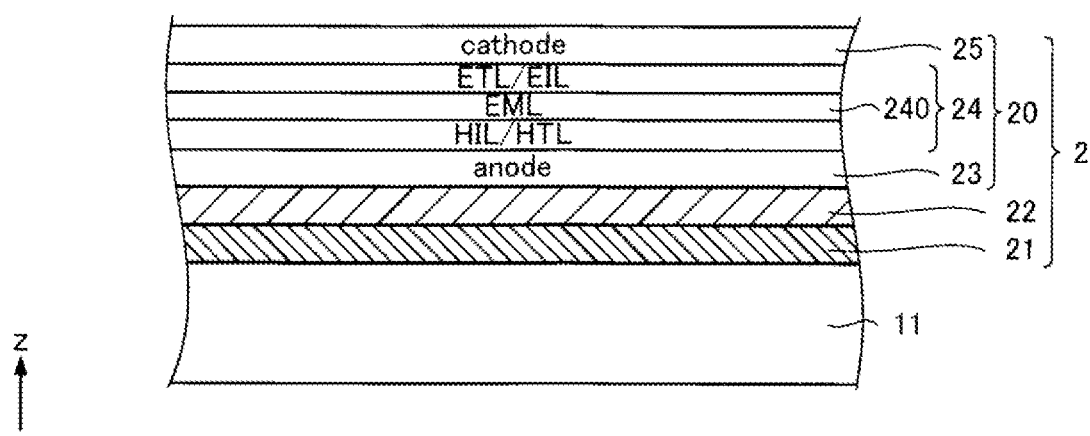
FIG. 7 is an explanatory view illustrating a light-emitting portion forming step according to a first embodiment.

FIG. 7 is an explanatory view illustrating the light-emitting portion forming step S12 according to the first embodiment. In the light-emitting portion forming step S12, the light-emitting portion 2 is formed on the substrate 11, as illustrated in FIG. 7.

First, a reflective layer 21 is formed on the substrate 11. The reflective layer 21 is formed by forming a metal film using sputtering method or vapor deposition method, and patterning the metal film using photolithography method, for example. Next, a resonance adjustment layer 22 is formed on the reflective layer 21. The resonance adjustment layer 22 is formed by forming an insulating film containing an inorganic material such as silicon oxide by vapor phase process such as CVD method or the like, and then performing a planarization process, for example. Next, a plurality of light-emitting elements 20 are formed on the resonance adjustment layer 22. Specifically, an anode 23 is firstly formed on the resonance adjustment layer 22. The method of forming the anode 23 is the same as the method of forming the reflective layer 21. Next, an organic layer 24 including a light-emitting layer 240 is formed on the anode 23. Each of the layers included in the organic layer 24 is deposited by, for example, vapor phase process. Next, a cathode 25 is formed on the organic layer 24. The method of forming the cathode 25 is the same as the method of forming the reflective layer 21.

Protective Film Forming Step S13

In the protective film forming step S13, although not specifically illustrated in the figure, a silicon nitride film is formed on the cathode 25 by, for example, CVD method using a plasma. This process leads to formation of the protective film 51. Further, using the CVD method allows the deposition rate to be increased compared to a case of using ALD method, to thus shorten deposition time of the protective film 51. In addition, using a plasma in the CVD method allows the protective film 51 having lower stress to be formed under a lower temperature compared to a case of using no plasma. This makes it possible to reduce an occurrence possibility of cracking or the like in the protective film 51.

Dielectric Multilayer Film Forming Step S14

Figure 8:
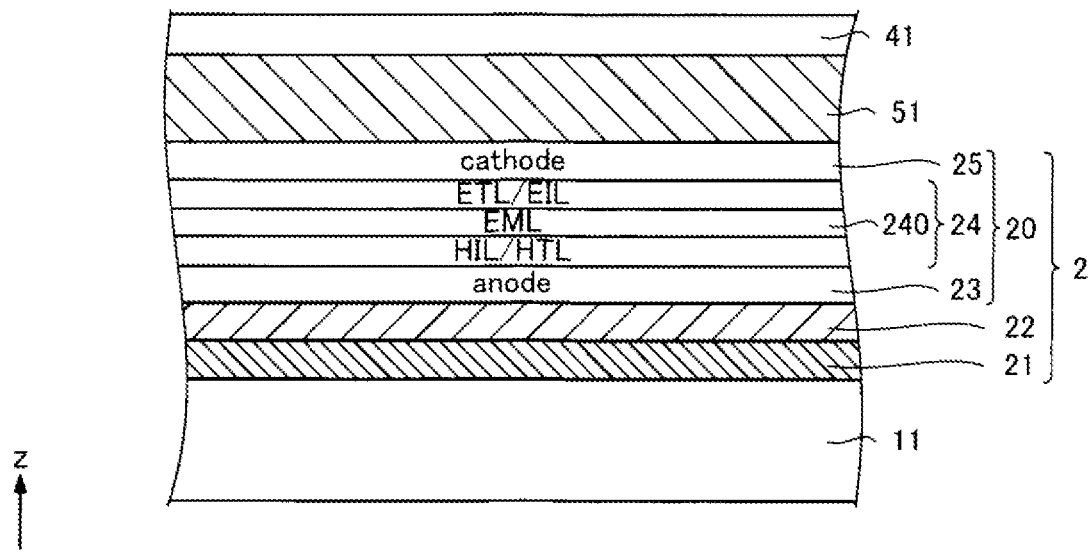
FIG. 8 is an explanatory view illustrating a dielectric multilayer film forming step according to a first embodiment.
Figure 9:
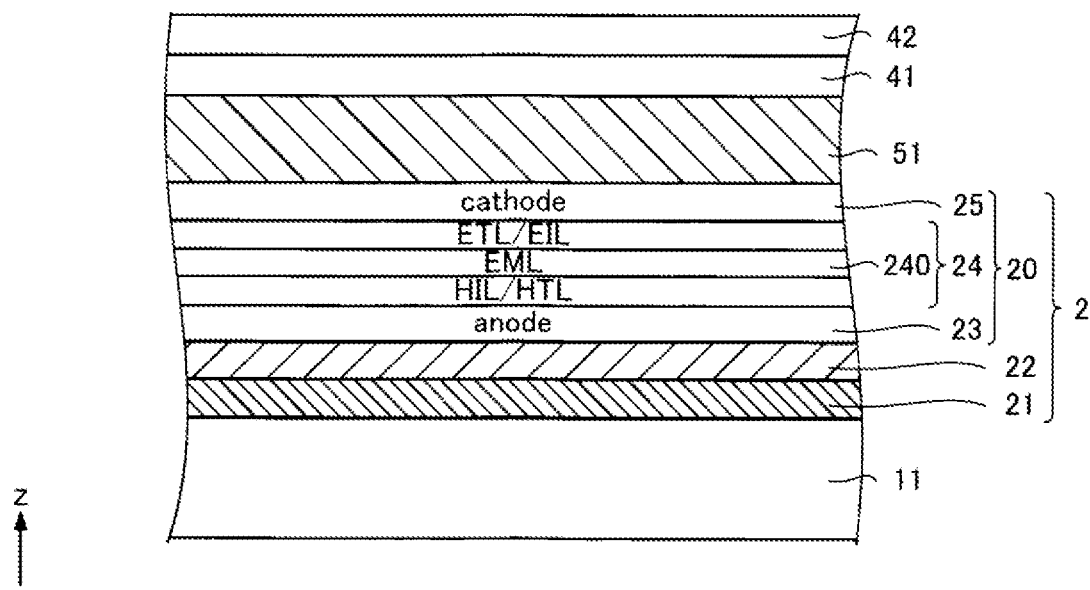
FIG. 9 is an explanatory view illustrating a dielectric multilayer film forming step according to a first embodiment.

FIGS. 8 and 9 are explanatory diagrams illustrating the dielectric multilayer film forming step S14 according to the first embodiment. In the dielectric multilayer film forming step S14, a low refractive index film 41 is firstly formed on the protective film 51 by, for example, ALD method using a plasma, as illustrated in FIG. 8. When the low refractive index film 41 is constituted by silicon oxide, a raw material for constituting the low refractive index film 41 may include an aminosilane based material. Specifically, examples of the raw material include tris-dimethylaminosilane ($SiH(CH_3)_2$)$_3$), SAM24: $H_2Si[N(C_2H_5)_2]_2$, and the like, for example. Note that SAM24 is a registered trademark.

Next, as illustrated in FIG. 9, a high refractive index film 42 is formed on the low refractive index film 41 by, for example, CVD method using a plasma. When the high refractive index film 42 is constituted by aluminum oxide, examples of a raw material for constituting the high refractive index film 42 include trimethylaluminum (($CH_3)_3Al$), for example. In addition, in the ALD method, a plasma may be used, and in particular, an $O_2$ plasma may be used. Using the $O_2$ plasma makes it possible to deposit the film under a lower temperature. This allows for reduction of stress in each of the low refractive index film 41 and the high refractive index film 42.

In similar manner as in the method described above, the low refractive index film 41 and the high refractive index film 42 are stacked on the high refractive index film 42. By stacking these layers, a dielectric multilayer film 4 is formed.

Color Filter Forming Step S15

In the color filter forming step S15, although not specifically illustrated in the figure, a color filter 61 is deposited on the dielectric multilayer film 4. Specifically, for example, a photosensitive resin including a desired monochromatic color material is firstly applied onto the dielectric multilayer film 4 using spin-coating method, to then be dried, to thus form a monochromatic color resin layer. Subsequently, the resin layer is exposed and then an alkaline developer solution or the like is discharged onto the resin layer, to thus remove the unexposed portion. Thereafter, the resin layer is cured to form the color filter 61.

Cover Bonding Step S16

In the cover bonding step S16, although not specifically illustrated in the figure, a transparent resin material is applied onto the color filter 61, the cover 63 constituted by a glass substrate or the like is placed on the applied resin material, and then a pressure is exerted against the cover 63. Then, when the resin material contains a photosensitive resin, for example, the photosensitive resin is irradiated with light, through the cover 63, to be cured. Due to the curing process, an adhesive layer 62 constituted by a cured product of a resin material is obtained. In addition, the adhesive layer 62 causes the cover 63 to adhere to the color filter 61.

Through the above processes, the display panel 10 of the organic EL device 1 is manufactured. Note that the display panel 10 is housed in the case 90 and is then coupled to the FPC board 95, to thus obtain the organic EL device 1.

As described above, the method for manufacturing the display panel 10 includes the light-emitting portion forming step S12 and the dielectric multilayer film forming step S14. In the light-emitting portion forming step S12, the light-emitting layer 240 including the light-emitting material, the reflective layer 21 as the "first reflective layer", and the cathode 25 as the "second reflective layer" are formed. In addition, in the dielectric multilayer film forming step S14, the dielectric multilayer film 4 disposed on an opposite side of the cathode 25 from the light-emitting layer 240 to cause light emitted from the cathode 25 as the "second reflective layer" to resonate, is formed.

The dielectric multilayer film 4 is formed, in addition to the light-emitting portion 2 having the light-emitting layer 240, the reflective layer 21, and the cathode 25, to thus make it possible to obtain the display panel 10 that can emit more intense spectrum of light having a narrower width than a case where the dielectric multilayer film 4 is not formed.

In addition, as described above, the plurality of dielectric films that constitute the dielectric multilayer film 4, that is, the low refractive index film 41 and the high refractive index film 42, are formed by ALD method using a plasma. Forming the low refractive index film 41 and the high refractive index film 42 using Atomic Layer Deposition (ALD) method makes it possible to accurately and easily deposit a layer having target film thickness.

1-2. Second Embodiment

Figure 10:
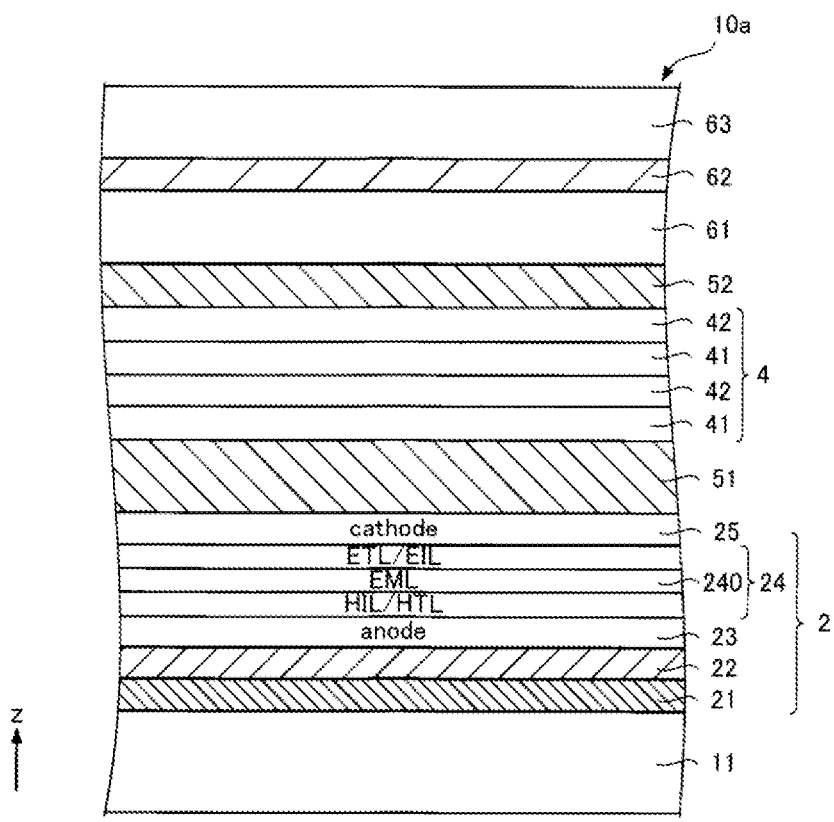
FIG. 10 is a view schematically illustrating a partial cross-section of a display panel according to a second embodiment.

Next, a second embodiment of the present disclosure will be described. FIG. 10 is a view schematically illustrating a partial cross-section of a display panel according to the second embodiment. The second embodiment differs from the first embodiment in that a second protective film 52 is provided. Note that, in the second embodiment, specific descriptions of the same matters as in the first embodiment will be appropriately omitted by using the same reference signs used in the description of the first embodiment.

A display panel 10a illustrated in FIG. 10 includes the second protective film 52 overlaid on the dielectric multilayer film 4. In other words, the display panel 10a includes the second protective film 52 disposed on an opposite side of the dielectric multilayer film 4 from the cathode 25. The second protective film 52 is disposed between the dielectric multilayer film 4 and the color filter 61 in a state being in contact with these components. The second protective film 52, which seals the light-emitting portion 2 and the dielectric multilayer film 4, protects the light-emitting layer 240 from atmospheric moisture and the like together with the protective film 51. The provision of the second protective film 52 allows the display panel 10a to improve sealing performance compared to the display panel 10 according to the first embodiment, while maintaining high light extraction efficiency in the first embodiment.

The second protective film 52 is constituted by an inorganic material containing silicon nitride or silicon oxynitride, for example. Note that the second protective film 52 may be constituted by the same material as the protective film 51, or may be constituted by a different material from the protective film 51. In addition, the second protective film 52 is favorably constituted by only one of silicon nitride or silicon oxynitride or only both of these materials, and may also contain other materials to the extent that the sealing performance of the second protective film 52 is not deteriorated.

The second protective film 52 can be formed using gas phase deposition method, and may be formed using plasma CVD method or ion plating method, in particular. Forming the film using plasma CVD method or an ion plating method allows the second protective film 52 of high density to be easily formed compared to a case of using other methods.

The second protective film 52 may have, but not particularly limited to, a thickness greater than the thickness of each of the low refractive index film 41 and the high refractive index film 42 that constitute the dielectric multilayer film 4, and thinner than the thickness of the protective film 51. The second protective film 52 having such a thickness enables sealing performance of the second protective film 52 to be sufficiently high, while preventing the display panel 10 from becoming excessively thick. Specifically, the second protective film 52 favorably has a thickness of not less than 100 nm and not greater than 1500 nm, and more favorably not less than 200 nm and not greater than 1200 nm, and still more favorably not less than 400 nm and not greater than 1000 nm.

In addition, in the second embodiment, the protective film 51, the dielectric multilayer film 4, and the second protective film 52 are all constituted by an inorganic material. All these components, being constituted by an inorganic material, can improve sealing performance compared to a case where any of these components is constituted by an organic material.

1-3. Third Embodiment

Figure 11:
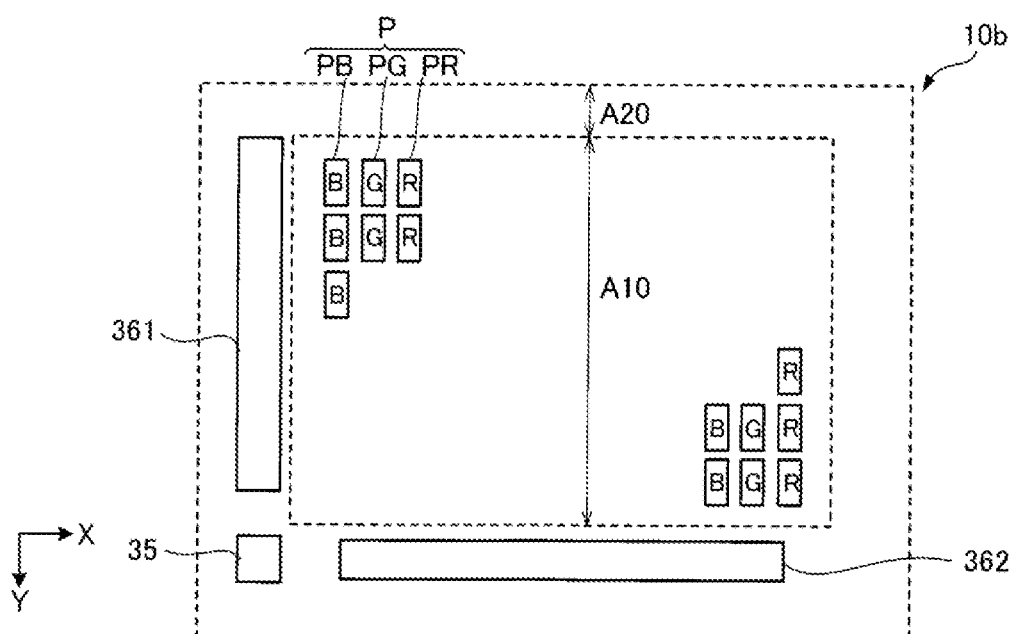
FIG. 11 is a plan view schematically illustrating a display panel according to a third embodiment.
Figure 12:
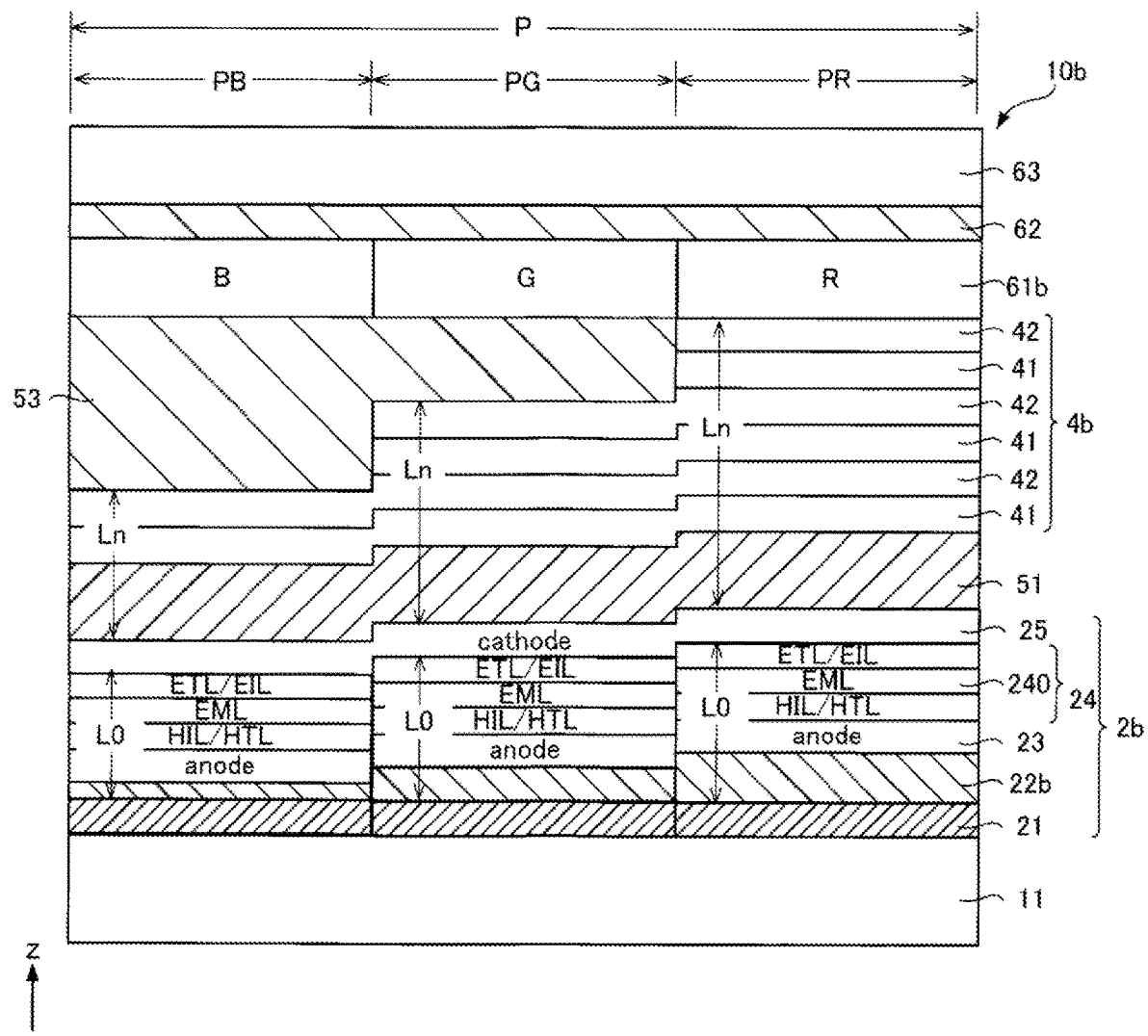
FIG. 12 is a view schematically illustrating a partial cross-section of a subpixel of a display panel according to a third embodiment.

Next, a third embodiment of the present disclosure will be described. FIG. 11 is a plan view schematically illustrating a display panel according to the third embodiment. FIG. 12 is a view schematically illustrating a partial cross-section of a subpixel of a display panel according to the third embodiment. The third embodiment differs from the first embodiment in that a full-color display is possible. Note that, in the third embodiment, specific descriptions of the same matters as in the first embodiment will be appropriately omitted by using the same reference signs used in the description of the first embodiment.

A display panel 10b illustrated in FIG. 11 includes a plurality of subpixels PB corresponding to a blue color wavelength range, a plurality of subpixels PG corresponding to a green color wavelength range, and a plurality of subpixels PR corresponding to a red color wavelength range. The subpixels PB, the subpixels PG, and the subpixels PR are arranged by the same color in the y direction, and are repeatedly arranged by the order of blue, green, and red in the x-axis direction. Note that the subpixels PB, the subpixels PG, and the subpixels PR may be freely arranged without being limited to the aforementioned rule. In addition, a single pixel P is constituted by the subpixel PB, the subpixel PG, and the subpixel PR from which blue, green, and red light can be obtained.

As illustrated in FIG. 12, the display panel 10b includes a light-emitting portion 2b that improves an intensity in the wavelength range of each of the colors, a dielectric multilayer film 4b that improves an intensity in the wavelength range of each of the colors, and color filters 61b corresponding to the respective colors.

The optical distance L0 of a resonance adjustment layer 22b included in the light-emitting portion 2b varies for each of the subpixels PB, PG, and PR. The optical distance L0 in the subpixel PB is set corresponding to light within the blue color wavelength range. The optical distance L0 in the subpixel PG is set corresponding to light within the green color wavelength range. The optical distance L0 in the subpixel PR is set corresponding to light within the red color wavelength range. The resonance adjustment layer 22b in the subpixel PB has the thinnest thickness, while the resonance adjustment layer 22b in the subpixel PR has the thickest thickness.

The optical distance Ln due to the dielectric multilayer film 4b varies for each of the subpixels PB, PG, and PR. The optical distance Ln in the subpixel PB is set corresponding to light within the blue color wavelength range. The optical distance Ln in the subpixel PG is set corresponding to light within the green color wavelength range. The optical distance Ln in the subpixel PR is set corresponding to light within the red color wavelength range. Note that, although in the illustrated figure, the dielectric multilayer film 4b in the subpixel PB has the thinnest thickness, and the dielectric multilayer film 4b in the subpixel PR has the thickest thickness, however, the relationship may vary among the thicknesses of the dielectric multilayer films 4b in each of the subpixels PB, PG, and PR without being limited to the aforementioned relationship.

Specifically, for example, the subpixels PB includes one layer of each of the low refractive index film 41 and the high refractive index film 42, the subpixels PG includes two layers of each of these films, and the subpixels PR includes three layers of each of these films. For example, the low refractive index film 41 is constituted by silicon dioxide, and the low refractive index film 41 is constituted by aluminum oxide. Further, in the subpixel PB, the low refractive index film 41 and the high refractive index film 42 each have a thickness of 40 nm, for example. Further, in the subpixel PG, the low refractive index film 41 and the high refractive index film 42 each have a thickness of 60 nm, for example. In the subpixel PR, the low refractive index film 41 and the high refractive index film 42 each have a thickness of 70 nm, for example. The thickness of each of the layers can be determined using the above-described relationship [2].

The optical distance L0 and the optical distance Ln in the resonance adjustment layer 22b are adjusted for each of the subpixels PB, PG, and PR to make it possible to achieve enhancement of intensity of light within each of the wavelength ranges and narrowing of spectrum of the light.

Note that, although in the illustrated figure, due to the uppermost layers located at different positions for each of the subpixels PB, PG, and PR of the dielectric multilayer film 4b, a step is formed at the surface of the dielectric multilayer film 4b on the +z side. To eliminate the step, a smoothing layer 53 having light transmissivity is disposed at the surface of the dielectric multilayer film 4b on the +z side. The smoothing layer 53 is thus disposed to flatten the surface of the color filter 61b. The smoothing layer 53 is configured to include an organic material such as acrylic resin, for example. Note that the smoothing layer 53 may not be provided.

In addition, the optical distance Ln may be set for each of the resonance wavelength ranges in the subpixels PB, PG, and PR, and may also be set to match any one of the resonance wavelength ranges. The dielectric multilayer film 4b may be configured differently, or may be configured identically for each of the subpixels PB, PG, and PR.

2. Head-Mounted Display

2-1. Fourth Embodiment

Figure 13:
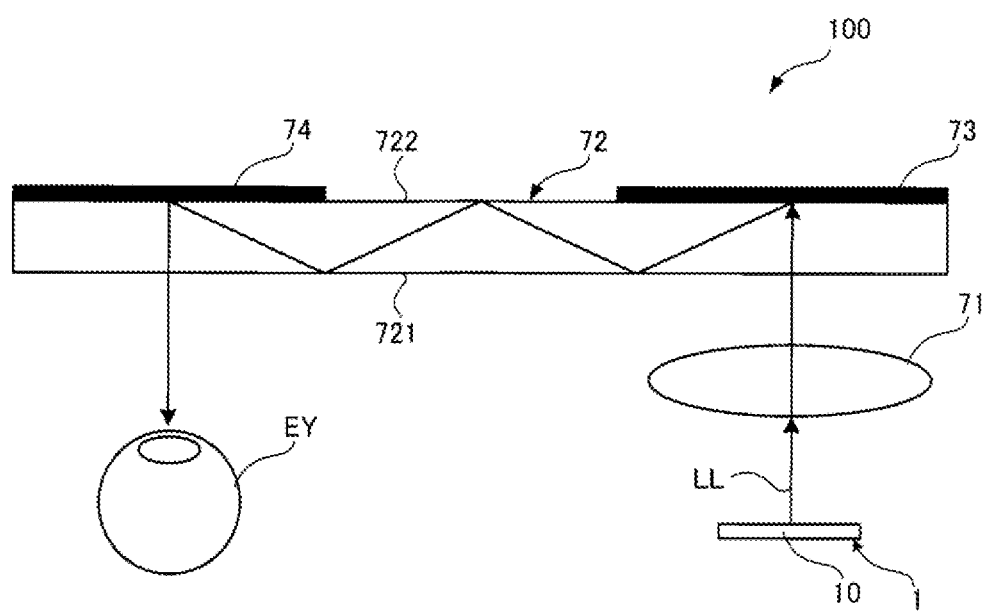
FIG. 13 is a plan view schematically illustrating a part of a virtual image display apparatus according to a fourth embodiment.

FIG. 13 is a plan view schematically illustrating a part of a virtual image display apparatus according to the fourth embodiment. A virtual image display apparatus 100 illustrated in FIG. 13 is a Head-Mounted Display (HMD) configured to perform displaying of images when being mounted on a head of the user. The virtual image display apparatus 100 includes the organic EL device 1 described above, a collimator 71, a light guide body 72, a first reflective volume hologram 73, and a second reflective volume hologram 74. Note that the organic EL device 1 includes the display panel 10 in the first embodiment, for example. Also note that the light emitted from the organic EL device 1 is emitted as projected image light LL.

The collimator 71 is disposed between the organic EL device 1 and the light guide body 72. The collimator 71 renders light emitted from the organic EL device 1 into a parallel beam of light. The collimator 71 is constituted by a collimating lens and the like. The light having been converted to the parallel beam of light by the collimator 71 is incident on the light guide body 72.

The light guide body 72, which forms a flat plate shape, is disposed extending in a direction intersecting a direction of light incident through the collimator 71. The light guide body 72 reflects and guides the light at its inside. The light guide body 72 is provided with, at a surface 721 facing the collimator 71, a light incident port through which light is incident and a light exit port through which light exits. The light guide body 72 is disposed with, on a surface 722 on an opposite side from the surface 721, the first reflective volume hologram 73 as a "diffractive optical element" and the second reflective volume hologram 74 as a "diffractive optical element". The first reflective volume hologram 73 is provided closer to the light exit port than the second reflective volume hologram 74. The first reflective volume hologram 73 and the second reflective volume hologram 74 have interference fringes corresponding to a predetermined wavelength range, and diffract and reflect light within the predetermined wavelength range.

In the virtual image display apparatus 100 thus configured, an observer can observe an image constituted by a virtual image formed due to the projected image light LL, when the projected image light LL being incident on the light guide body 72 through the light incident port is repeatedly reflected and advances to be guided, through the light incident port, to a pupil EY of the observer.

In addition, the virtual image display apparatus 100 is an HMD provided with the organic EL device 1 described above. According to the organic EL device 1 described above, an enhancement of intensity and narrowing of light can be achieved, to thus provide an image with high light brightness to the observer.

Moreover, as described above, the virtual image display apparatus 100 includes the first reflective volume hologram 73 and the second reflective volume hologram 74 that diffract light emitted from the organic EL device 1. In the fourth embodiment, the resonance wavelength range by the dielectric multilayer film 4 included in the organic EL device 1 overlaps a wavelength of light at which the first reflective volume hologram 73 and the second reflective volume hologram 74 diffract the light. This allows for reduction of unutilized light passing through the first reflective volume hologram 73 and the second reflective volume hologram 74. In particular, according to the organic EL device 1 described above, an enhancement of intensity and narrowing of light can be achieved, to thus enhance an effect of reducing unutilized light passing through the first reflective volume hologram 73 and the second reflective volume hologram 74. This achieves enhancement of light utilization efficiency in the virtual image display apparatus 100, to thus improve light brightness of an image.

Figure 14:
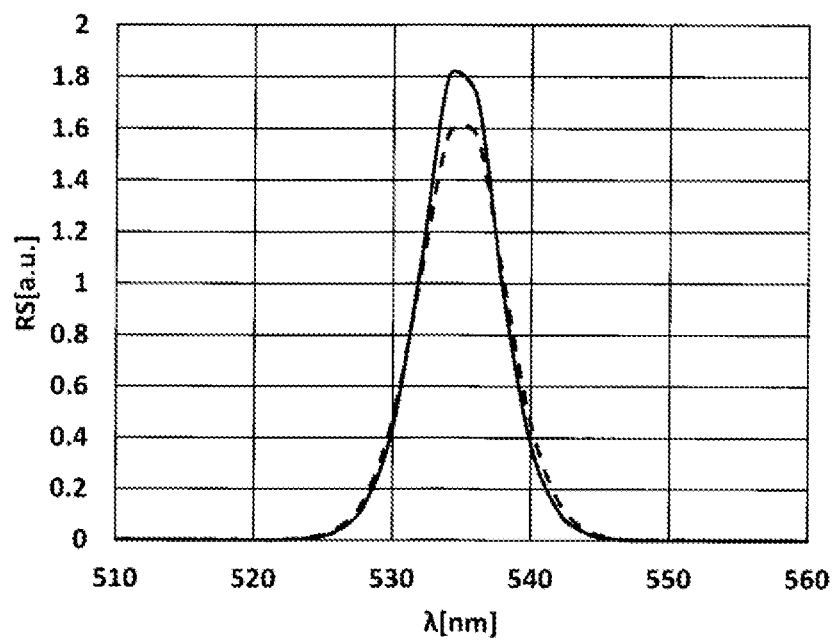
FIG. 14 is a graph depicting a spectrum of light within a green color wavelength range diffracted and reflected at a hologram.

FIG. 14 is a graph depicting a spectrum of light diffracted and reflected at a hologram. In the example in this figure, a spectrum is depicted when light within a green color wavelength range is diffracted and reflected at a hologram having spectral transmittance corresponding to the green color wavelength range. In addition, a solid line in FIG. 14 represents a spectrum when the light-emitting portion 2 and the dielectric multilayer film 4 are provided, and a dashed line in FIG. 14 represents a spectrum when the dielectric multilayer film 4 is not provided. The horizontal axis of the graph represents a wavelength λ [nm], and the vertical axis represents a relative intensity RS [a.u.]. As recognizable from FIG. 10, the provision of the dielectric multilayer film 4 achieves enhancement of intensity of light within a predetermined wavelength range. Thus, an image with higher brightness can be provided to the observer compared to a case where the dielectric multilayer film 4 is not provided.

Note that the organic EL device 1 included in the virtual image display apparatus 100 may include the display panel 10a in the second embodiment or the display panel 10b in the third embodiment. When the organic EL device 1 includes the display panel 10b in the third embodiment, the resonance wavelength range by the dielectric multilayer film 4b may overlap, for each of the colors, with a wavelength ranges of light at which the first reflective volume hologram 73 and the second reflective volume hologram 74 diffract the light. The overlapping of these ranges makes it possible to reduce unutilized light passing through the first reflective volume hologram 73 and the second reflective volume hologram 74 compared to a case where these ranges do not overlap with each other.

2-2. Fifth Embodiment

Figure 15:
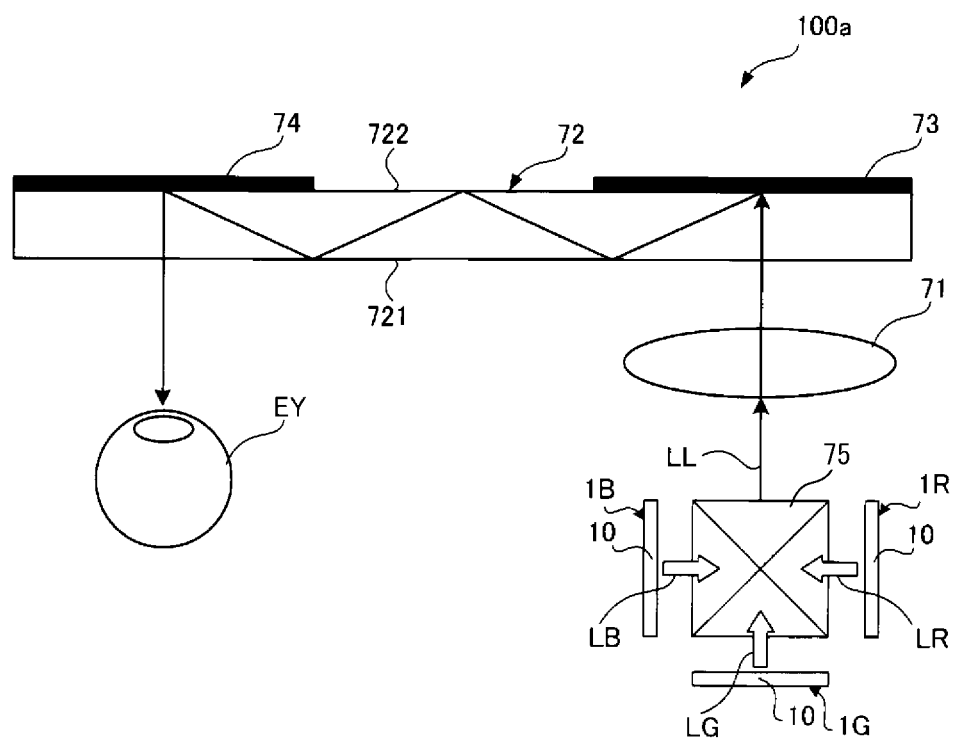
FIG. 15 is a plan view schematically illustrating a part of a virtual image display apparatus according to a fifth embodiment.

FIG. 15 is a plan view schematically illustrating a part of a virtual image display apparatus according to the fifth embodiment. The fifth embodiment differs from the fourth embodiment in that a photosynthetic element 75 is provided. Note that, in the fifth embodiment, specific descriptions of the same matters as in the fourth embodiment will be appropriately omitted by using the same reference signs used in the description of the fourth embodiment.

A virtual image display apparatus 100a illustrated in FIG. 15 includes a plurality of organic EL devices 1B, 1G, and 1R, and the photosynthetic element 75. The organic EL device 1B is configured to emit light LB within a blue color wavelength range, the organic EL device 1G is configured to emit light LG within a green color wavelength range, and the organic EL device 1R is configured to emit light LR within a red color wavelength range. The organic EL devices 1B, 1G, and 1R each include the display panel 10a in the first embodiment. Further, in each of the organic EL devices 1B, 1G, and 1R, the resonance wavelength range between the reflective layer 21 and the cathode 25 overlaps the resonance wavelength range by the dielectric multilayer film 4. Further, the resonance wavelength range between the reflective layer 21 and the cathode 25 or the resonance wavelength range by the dielectric multilayer film 4 differs from each other in the organic EL devices 1B, 1G, and 1R. Further, any one of the organic EL devices 1B, 1G, and 1R corresponds to a "first organic electroluminescence device", and the light emitted from one of the organic EL devices 1B, 1G, or 1R corresponds to a "first light". In addition, another one of the organic EL devices 1B, 1G, and 1R corresponds to a "second organic electroluminescence device", and the light emitted from still another one of the organic EL devices 1B, 1G, and 1R corresponds to a "second light".

The photosynthetic element 75 synthesizes the light LB emitted from the organic EL device 1B, the light LG emitted from the organic EL device 1G, and the light LR emitted from the organic EL device 1R, and emits the synthesized light as the projected image light LL. The photosynthetic element 75 is constituted by, for example, a dichroic prism or the like. Due to the dichroic prism having spectral characteristics, the extraction efficiency of light is required to be further improved more than in the fourth embodiment in order to display an image in conjunction with the first reflective volume hologram 73 and the second reflective volume hologram 74. In the fifth embodiment, the resonance wavelength ranges between the reflective layer 21 and the cathode 25 in the organic EL devices 1B, 1G, and 1R are optimized corresponding to each of the colors. In addition, the resonance wavelength ranges by the dielectric multilayer film 4 in the organic EL devices 1B, 1G, and 1R are optimized corresponding to each of the colors. Optimizing these resonance wavelength ranges makes it possible to enhance the extraction efficiency of each of the colors, to enhance the luminance of the virtual image display apparatus 100 and to expand the color gamut.

For example, optimizing the configuration of the dielectric multilayer film 4 at each of the colors makes it possible to improve brightness and color gamut of an image in a range of not less than 0.1% and not greater than 10%, compared to a case where the dielectric multilayer film 4 is not provided. For example, the dielectric multilayer films 4 included in the organic EL devices 1B, 1G, and 1R can be set as follows. Specifically, the dielectric multilayer film 4 included in the organic EL device 1B includes one layer of each of the low refractive index film 41 having a thickness of 40 nm constituted by silicon dioxide, and the high refractive index film 42 having a thickness of 40 nm constituted by aluminum oxide. The dielectric multilayer film 4 included in the organic EL device 1G includes two layers of each of the low refractive index film 41 having a thickness of 60 nm constituted by silicon dioxide and the high refractive index film 42 having a thickness of 60 nm constituted by aluminum oxide. The dielectric multilayer film 4 included in the organic EL device 1R includes one layer of each of the low refractive index film 41 having a thickness of 70 nm constituted by silicon dioxide and the high refractive index film 42 having a thickness of 70 nm constituted by aluminum oxide. Optimizing the configuration of the dielectric multilayer film 4 in each of the colors in such a way makes it possible to optimize the extraction efficiency of each of the colors, and to improve brightness and color gamut of an image.

3-1. Electronic Apparatus

The organic EL device 1 of the above-described embodiments can be applied to various types of electronic apparatuses.

Figure 16:
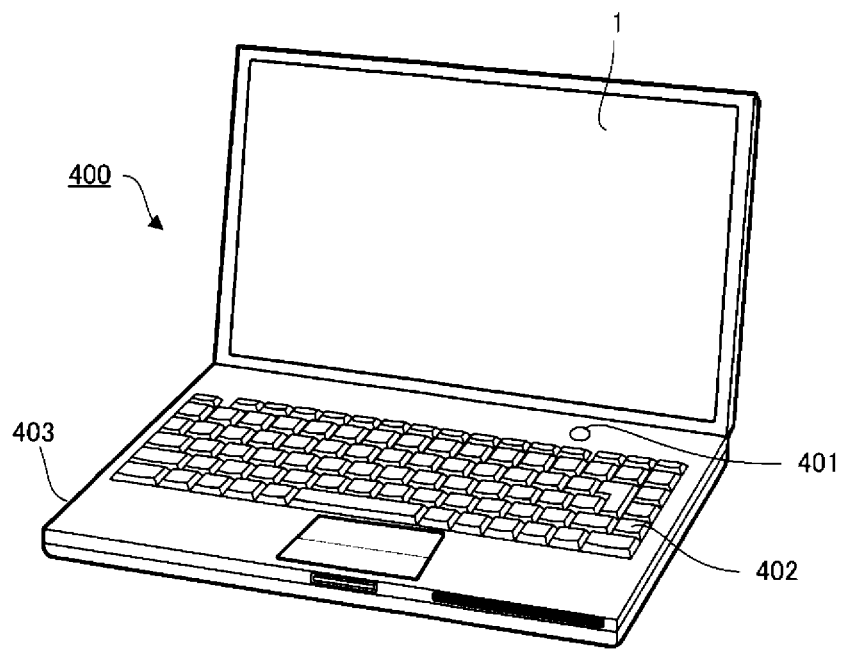
FIG. 16 is a perspective view illustrating a personal computer as an example of an electronic apparatus according to the present disclosure.

FIG. 16 is a perspective view illustrating a personal computer as an example of an electronic apparatus according to the present disclosure. A personal computer 400 includes the organic EL device 1, and a main body 403 provided with a power switch 401 and a keyboard 402.

The personal computer 400 including the organic EL device 1 described above is excellent in brightness and color gamut of an image. Thus, the provision of the organic EL device 1 makes it possible to provide the personal computer 400 having high display quality.

Note that, examples of an "electronic apparatus" including the organic EL device 1 includes, in addition to the personal computer 400 exemplified in FIG. 16, an apparatus disposed in a state close to the eyes such as a digital scope, a digital binocular, a digital still camera, or a video camera. In addition, the "electronic apparatus" including the organic EL device 1 is applied as a mobile phone, a smartphone, Personal Digital Assistants (PDA), a car navigation device, or an automotive display. Moreover, the "electronic apparatus" including the organic EL device 1 is applied as illumination for illuminating light.

The present disclosure has been described above based on the illustrated embodiments, however, the present disclosure is not limited to the above-described embodiments. Further, the configuration of each component of the present disclosure may be replaced with any configuration that exerts the equivalent functions of the above-described embodiments, and to which any configuration may be added. In addition, any configuration may be combined with each other in the above-described embodiments of the present disclosure.

What is claimed is:

1. A head-mounted display, comprising:
   a plurality of organic electroluminescence devices, each organic electroluminescence device comprising:
      a light-emitting layer containing a light-emitting material;
      a first reflective layer configured to reflect light generated in the light-emitting layer;
      a second reflective layer disposed on an opposite side of the light-emitting layer from the first reflective layer, the second reflective layer having light reflectivity and light transmissivity to cause light generated in the light-emitting layer to resonate between the second reflective layer and the first reflective layer; and
      a dielectric multilayer film disposed on an opposite side of the second reflective layer from the light-emitting layer, the dielectric multilayer film causing light emitted from the second reflective layer to resonate; and
   a photosynthetic element configured to synthesize light and emit the synthesized light, wherein
   a resonance wavelength range between the first reflective layer and the second reflective layer overlaps a resonance wavelength range by the dielectric multilayer film in each of the plurality of organic electroluminescence devices,
   the resonance wavelength range between the first reflective layer and the second reflective layer, or the resonance wavelength range by the dielectric multilayer film differ among the plurality of organic electroluminescence devices, and
   the photosynthetic element synthesizes light emitted from each of the plurality of organic electroluminescence devices.

2. The head-mounted display according to claim 1, wherein a resonance wavelength range between the first reflective layer and the second reflective layer overlaps a resonance wavelength range by the dielectric multilayer film.

3. The head-mounted display according to claim 1, further comprising:
a protective film disposed between the second reflective layer and the dielectric multilayer film, the protective film protecting the light-emitting layer.

4. The head-mounted display according to claim 3, wherein
the protective film contains silicon nitride or silicon oxynitride.

5. The head-mounted display according to claim 3, further comprising:
a second protective film disposed on an opposite side of the dielectric multilayer film from the second reflective layer, the second protective film protecting the light-emitting layer.

6. The head-mounted display according to claim 1, wherein
a plurality of electric films that constitute the dielectric multilayer film each contain aluminum oxide or silicon oxide.

7. The head-mounted display according to claim 1, further comprising:
a diffractive optical element configured to diffract light emitted from the organic electroluminescence device, wherein
a resonance wavelength range by the dielectric multilayer film overlaps a wavelength range of light diffracted by the diffractive optical element.

8. An organic electroluminescence device comprising:
a first organic electroluminescence device;
a second organic electroluminescence device;
a photosynthetic element configured to synthesize first light from the first organic electroluminescence device and second light from the second organic electroluminescence device, wherein
the first organic electroluminescence device and the second organic electroluminescence device include:
a light-emitting layer containing a light-emitting material;
a first reflective layer configured to reflect light generated in the light-emitting layer;
a second reflective layer disposed on an opposite side of the light-emitting layer from the first reflective layer, the second reflective layer having light reflectivity and light transmissivity to cause light generated in the light-emitting layer to resonate between the second reflective layer and the first reflective layer; and
a dielectric multilayer film disposed on an opposite side of the second reflective layer from the light-emitting layer, the dielectric multilayer film causing light emitted from the second reflective layer to resonate,
in the first organic electroluminescence device, a first resonance wavelength range between the first reflective layer and the second reflective layer overlaps a second resonance wavelength range by the dielectric multilayer film,
in the second organic electroluminescence device, a third resonance wavelength range between the first reflective layer and the second reflective layer overlaps a fourth resonance wavelength range by the dielectric multilayer film, and
the second resonance wavelength range by the dielectric multilayer film in the first organic electroluminescence device differs from the fourth resonance wavelength range by the dielectric multilayer film in the second organic electroluminescence device.

9. An electronic apparatus, comprising the organic electroluminescence device according to claim 8.

* * * * *